(12) United States Patent
Badre et al.

(10) Patent No.: US 8,475,869 B2
(45) Date of Patent: Jul. 2, 2013

(54) SELECTIVE NANOPARTICLE ASSEMBLY SYSTEMS AND METHODS

(75) Inventors: Chantal Badre, Guttenberg, NJ (US); Jean-Paul Chapel, Bordeaux (FR); Shu Yang, Blue Bell, PA (US); Jean-Christophe Castaing, Burlington, NJ (US)

(73) Assignees: Rhodia Operations, Aubervilliers (FR); Centre National de la Recherche Scientifique—CNRS, Paris Cedex (FR); The Trustees of The University of Pennsylvania, Philadelphia, PA (US)

(*) Notice: Subject to any disclaimer, the term of this patent is extended or adjusted under 35 U.S.C. 154(b) by 280 days.

(21) Appl. No.: 13/078,583

(22) Filed: Apr. 1, 2011

(65) Prior Publication Data
US 2011/0244116 A1    Oct. 6, 2011

Related U.S. Application Data

(60) Provisional application No. 61/341,651, filed on Apr. 2, 2010.

(51) Int. Cl.
*B05D 1/12* (2006.01)
*B05D 1/28* (2006.01)
*B05C 1/08* (2006.01)

(52) U.S. Cl.
USPC ............ 427/197; 427/199; 427/202; 118/244

(58) Field of Classification Search
USPC ............................ 427/197, 199, 202; 118/244
See application file for complete search history.

(56) References Cited

U.S. PATENT DOCUMENTS

| | | | |
|---|---|---|---|
| 4,557,886 A * | 12/1985 | Kiess et al. | 264/105 |
| 6,180,239 B1 | 1/2001 | Whitesides et al. | |
| 7,117,790 B2 | 10/2006 | Kendale et al. | |
| 7,267,938 B2 | 9/2007 | Anderson et al. | |
| 7,338,613 B2 | 3/2008 | Schueller et al. | |
| 7,771,647 B2 | 8/2010 | Jacobs et al. | |
| 2003/0131745 A1* | 7/2003 | Sauer et al. | 101/375 |
| 2005/0003961 A1* | 1/2005 | Van Den Brink et al. | 502/439 |
| 2009/0199960 A1 | 8/2009 | Nuzzo et al. | |
| 2009/0294958 A1* | 12/2009 | Hu | 257/737 |

FOREIGN PATENT DOCUMENTS

| | | | |
|---|---|---|---|
| GB | 2 387 268 | * | 8/2003 |
| KR | 10-2009-0127680 A | | 12/2009 |

OTHER PUBLICATIONS

Younan Xia et al., Soft Lithography, Angew. Chem. Int. Ed. 1998, 37, 550-575.

(Continued)

*Primary Examiner* — Frederick Parker
(74) *Attorney, Agent, or Firm* — Novak Druce Connolly Bove + Quigg, LLP

(57) ABSTRACT

Disclosed are methods and systems for transferring dry or semi-dry nanoparticles onto a substrate. In one embodiment, this includes the steps of providing a roller comprising an elastomeric stamp; transferring nanoparticles in a dry or semi-dry state, and which contact the surface of a donor substrate, from the donor substrate onto the elastomeric stamp; and depositing the dry or semi-dry nanoparticles from the elastomeric stamp onto a receiver substrate by rolling the elastomeric stamp onto the receiver substrate. The substrate, in other embodiments, can have a relief structure.

37 Claims, 5 Drawing Sheets

OTHER PUBLICATIONS

Younan Xia et al., Microcontact Printing with a Cylindrical Rolling Stamp: A Practical Step Toward Automatic Manufacturing of Patterns with Submicrometer-Sized Features, Adv. Mater. 1996, 8, No. 12, 1015-1017.

Pirmin C Hidber et al., New Strategy for Controlling the Size and Shape of Metallic Features Formed by Electroless Deposition of Copper: Microcontact Printing of Catalysts on Oriented Polymers, Followed by Thermal Shrinkage, Langmuir 1996, 12, 5209-5215.

Pirmin C. Hidber et al., Microcontact Printing of Palladium Colloids: Micron-Scale Patterning by Electroless Deposition of Copper, Langmuir 1996, 12, 1375-1380.

International Search Report dated Feb. 17, 2012 from PCT/US2011/030951.

Michel et al, Printing meets lithography: Soft approaches to high-resolution patterning, IBM J. Res. & Dev., vol. 45, No. 5, pp. 697-719 (Sep. 2001).

\* cited by examiner

SELECTIVE NANOPARTICLE ASSEMBLY SYSTEMS AND METHODS

CROSS-REFERENCE TO RELATED APPLICATIONS

This claims the benefit of provisional U.S. patent application No. 61/341,651 filed Apr. 2, 2010, incorporated herein by reference in its entirety. The claimed invention was made as a result of activities undertaken within the scope of a joint research agreement that was in effect on or before the date the claimed invention was made. Rhodia Operations, Centre Nationale De La Recherche Scientifique and The Trustees of the University of Pennsylvania are the parties to the joint research agreement.

FIELD OF THE INVENTION

The present invention relates to systems and methods for forming a layer of a material on a substrate and, in particular, forming patterns of nanoparticles on a non-planar substrate.

BACKGROUND OF THE INVENTION

In the field of microelectric devices, optics, sensors and biochemical sensors, among others, such devices require patterning of materials, which may be conductive, semi-conductive or dielectric. Traditional techniques utilize photolithographic processes to form patterns. However, such traditional techniques require extensive processing, relatively sophisticated equipment/materials, and is time-consuming. For example, according to photolithography techniques, a negative or positive photoresist is coated onto a thin film of conductive, semi-conductive or insulating material on a substrate. The photoresist is then irradiated in a desired pattern and portions of the resist (in some cases, the irradiated portions and, in other cases, the non-irradiated portions) are washed away. To form a pattern of conductive, semi-conductive or insulating material, such material that is not covered by the remaining photoresist is then removed, followed by removal of the remaining photoresist. What remains on the substrate is a pattern of the conductive, semi-conductive or insulating material. As described above, such photolithographic techniques require extensive processing and take a significant amount of time. Further, developing small features (e.g., less than 100 nm) and patterning on non-planar substrates still pose challenges to such photolithographic technique.

Several non-lithographic techniques have been demonstrated for fabricating microstructures. Soft lithography techniques, for example, are used to prepare microstructures, among them, micro contact printing (µCP), replica molding (REM), embossing, etc. Contact printing is a flexible, non-lithographic method for forming patterned materials.

Microcontact printing, for example, allows patterns of microparticles to be imparted onto a substrate surface.

U.S. Pat. No. 6,180,239 to Whitesides et al. discloses a method of forming a patterned self-assembled monolayer on a surface and derivative articles are provided. According to one method, an elastomeric stamp is deformed during and/or prior to using the stamp to print a self-assembled molecular monolayer on a surface. According to another method, during monolayer printing the surface is contacted with a liquid that is immiscible with the molecular monolayer-forming species to effect controlled reactive spreading of the monolayer on the surface. Methods of printing self-assembled molecular monolayers on nonplanar surfaces and derivative articles are provided, as are methods of etching surfaces patterned with self-assembled monolayers, including methods of etching silicon. Optical elements including flexible diffraction gratings, mirrors, and lenses are provided, as are methods for forming optical devices and other articles using lithographic molding. A method for controlling the shape of a liquid on the surface of an article is provided, involving applying the liquid to a self-assembled monolayer on the surface, and controlling the electrical potential of the surface.

U.S. Pat. No. 7,338,613 to Schueller et al. discloses an automated process for microcontact printing is provided, comprising the steps of providing a substrate and a stamp; automatically aligning the substrate and stamp so that the stamp is aligned relative to the substrate to impart a pattern to the substrate at a desired location and with a desired orientation on the substrate; applying an ink to the stamp, the ink including a molecular species adapted to form a self-assembling monolayer (SAM) on the substrate; contacting the stamp and the substrate; and separating the stamp from the substrate.

Microcontact printing techniques are also less costly and time-consuming than traditional photolithography processes since it is procedurally less complex, ultimately not requiring spin coating equipment or a sequential development step. These techniques use an elastomeric stamp to transfer the pattern and to form SAMs patterns while transferring molecules of the "ink" to the surface of the substrate by contact. Usually, alkanethiolates SAMs are formed on gold and can be widely used in microelectronics. Patterned inks were formed essentially on planar surfaces, very few trials were reported on non-planar substrates where µCP was used to form pattern of gold on a gold coated glass capillaries with hexanedecanethiol followed by selective etching in an aqueous solution of cyanide. SAM printing is capable of creating high resolution patterns, but is generally limited to forming metal patterns of gold or silver with thiol chemistry. Thiol chemistry is normally associated with a dispersing agent.

In SAM printing, a positive relief pattern provided on an elastomeric stamp is inked onto a substrate. The relief pattern of the elastomeric stamp, which is typically made of polydimethylsiloxane (PDMS), is inked with SAM molecules, e.g., thiol materials. This is traditionally necessary as without a dispersing agent, such thiol materials tend to undesirably agglomerate. The substrate is coated with a thin metal film of gold or silver. The gold or silver-coated substrate is then contacted with the stamp where a monolayer of the thiol material having the desired microcircuit pattern (i.e., of the relief pattern) is transferred to the metal film. Then when the substrate is then etched in, for example, a batch etching process, the SAM acts as an etch resist. The SAM un-protected metal areas are then etched away to the underlying substrate. The SAM is then stripped away leaving the metal in the desired pattern.

The drawbacks however are that microcontact printing via thiol chemistry is limited to only a few metals with resolutions on or the order of only 50 microns or less. Other drawbacks are the material to be printed does not effectively wet the surface of the stamp thus making for an incomplete pattern of material on the substrate.

SUMMARY OF THE INVENTION

It is desirable to provide a method and system to directly transfer a functional material onto a substrate. The functional material can be a semi-conductive, conductive, and/or dielectric or other insulative material. The method of the present invention in some embodiments is a photolithography-free microcontact printing method.

The present invention will be described in greater detail, which in one aspect is a method of transferring dry or semi-dry nanoparticles onto a substrate comprising the steps of: providing a roller comprising an elastomeric stamp; transferring nanoparticles in a dry or semi-dry state, and which contact the surface of a donor substrate, from the donor substrate onto the elastomeric stamp; depositing the dry or semi-dry nanoparticles from the elastomeric stamp onto a receiver substrate by rolling the elastomeric stamp onto the substrate.

In one embodiment, the step of transferring nanoparticles from the donor substrate comprises the process of rolling the elastomeric stamp onto the donor substrate. This process of rolling effectively transfers the nanoparticles in contact with the donor substrate to the surface of the roller. In one embodiment, the nanoparticles are in the dry state. In one embodiment, the substrate is a non-planar substrate. In one embodiment, the elastomeric stamp has a relief structure comprising a first pattern, whereby the nanoparticles are deposited onto the surface in the first pattern.

In one embodiment, this method of transferring dry or semi-dry nanoparticles onto the substrate takes less than 10 seconds, or takes less than 5 seconds or takes less than 1 second.

In another aspect, the present invention is a method of transferring dry or semi-dry nanoparticles onto a receiver substrate comprising the steps of:

providing a roller comprising an elastomeric stamp having a first relief structure;

transferring nanoparticles in a dry or semi-dry state, which nanoparticles contact the surface of a donor substrate, from the donor substrate onto the elastomeric stamp; and depositing the dry or semi-dry nanoparticles from the elastomeric stamp onto a receiver substrate having a second relief structure by rolling the elastomeric stamp onto the receiver substrate in a predetermined direction.

In one embodiment, the first relief structure is capable of forming a first pattern of nanoparticles. The second relief structure is capable of forming a second pattern of nanoparticles. Rolling of the roller in the predetermined direction, however, transfers the nanoparticles onto the receiver substrate in a third pattern. This pattern in one embodiment is different from either the first pattern or the second pattern. This can be accomplished even though the first pattern and the second pattern are substantially the same. In some embodiments, the first pattern and second pattern are different. In one embodiment, the step of transferring nanoparticles from the donor substrate comprises the process of rolling the elastomeric stamp onto the donor substrate. This process of rolling effectively transfers the nanoparticles in contact with the donor substrate to the surface of the roller. In one embodiment, the nanoparticles are in the dry state. In one embodiment, the substrate is a non-planar substrate.

In one embodiment, the method of transferring dry or semi-dry nanoparticles onto the substrate takes less than 10 seconds, or takes less than 5 seconds or takes less than 1 second.

In yet another aspect, the present invention is a method of patterning a substrate with at least two species of nanoparticles, the method comprising the steps of: providing a roller comprising a first elastomeric stamp having a first relief structure, the first relief structure capable of forming a first pattern of nanoparticles; transferring a first species of nanoparticles in a dry or semi-dry state, which first species of nanoparticles contact the surface of a first donor substrate, from the first donor substrate onto the first elastomeric stamp; depositing the first species of nanoparticles from the first elastomeric stamp onto a receiver substrate by rolling the elastomeric stamp onto the receiver substrate in a first predetermined direction; providing a roller comprising a second elastomeric stamp having a second relief structure, the second relief structure capable of forming a second pattern of nanoparticles; transferring a second species of nanoparticles in a dry or semi-dry state, which second species of nanoparticles contact the surface of a second donor substrate, from the second donor substrate onto the second elastomeric stamp; and depositing the second species of nanoparticles from the second elastomeric stamp onto the receiver substrate by rolling the second elastomeric stamp onto the receiver substrate in a second predetermined direction.

In one embodiment, the first elastomeric stamp has a first relief structure. The second elastomeric stamp has a second relief structure. Both relief structures are capable of forming substantially the same or different pattern of nanoparticles. In one embodiment, the first pattern of nanoparticles and the second pattern of nanoparticles are substantially the same. However, the patterns may differ if desired. In another embodiment, the first predetermined direction and the second predetermined direction are substantially the same. However, the directions may differ if desired. In one embodiment, the nanoparticles are in the dry state. In one embodiment, the substrate is a non-planar substrate. In one embodiment, the method of transferring dry or semi-dry nanoparticles onto the substrate takes less than 10 seconds, or takes less than 5 seconds or takes less than 1 second.

The present invention advantageously avoids photolithographic process problems. For example, in the present invention the elastomeric covering on the roller is advantageously a PDMS stamp. The generation of mechanical instability specifically wrinkling can be done by buckling a bilayer system, where a thin guard film coated on top of an expanded soft substrate (e.g, PDMS) undergoes a compressive force. The compressive strain in the top layer can be provided either by applying a mechanical strain (using an oxygen plasma or UVO treatment) or by shrinking (expanding) its present state than its equilibrium stress-free state by lowering (raising) the temperature or application of a solvent. Using a roller has advantages over contacting flat surface to another flat surface. In the present invention, a microcontact printing based on a cylindrical roller is applied to transfer/print the pattern.

In conventional microcontact printing, a PDMS stamp is inked with liquid material (such as alkane thiol). However, in the present invention, the PDMS roller stamp can be covered by particles. This is done by rolling the stamp on a substrate already covered by a layer of particles. This layer of particles is formed by any type of coating from an aqueous or solvent dispersion. The immobilized particles are considered solid objects and not an ink easily transferred to any other substrate by simply rolling the stamp on the substrate.

In the present invention, the PDMS stamp relief structures are not prepared by photolithography, the ink is solid. The patterns are easily generated with a single step of transfer/printing. The present method directly forms a functional pattern on any desired substrate. In the present invention micro or nanometric features of the applied patterns can be varied depending on the techniques and parameters used to prepare the PDMS stamp, for example varying the time of exposure to oxygen plasma and UVO treatment lead to different relief structures and then to obtain desired nanometric and micrometric patterns.

The present invention also includes a system for transferring dry or semi-dry nanoparticles onto a substrate comprising:

a roller comprising an elastomeric stamp;
nanoparticles;
a donor substrate for transferring the nanoparticles in a dry state or a semi-dry state, and which contact the surface of the donor substrate, from the donor substrate onto the elastomeric stamp; and
a receiver substrate for receiving the dry or semi-dry nanoparticles from the elastomeric stamp onto the receiver substrate during rolling the elastomeric stamp onto the receiver substrate.

DETAILED DESCRIPTION OF THE PREFERRED EMBODIMENTS

Figure 1:
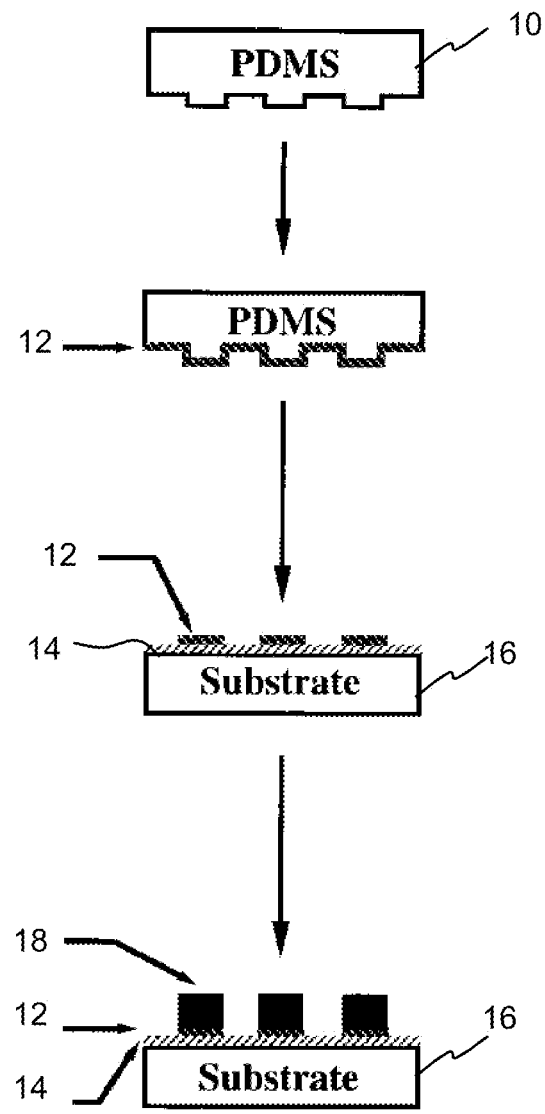
FIG. 1 shows a schematic representation of a prior art procedure for microcontact printing of colloids.

The present invention utilizes a soft lithography processes. As used herein, "soft lithography" refers to a patterning process in which a stamp having a pattern, specifically a topographical pattern, and a flexible or elastomeric morphology is placed in contact with a surface (of a substrate). The topographical pattern in the elastomeric stamp is transferred to the surface by imprinting or molding of a certain material from the topographical pattern in the surface of the stamp to the surface of the substrate. The present invention provides a system and method to form a layer of one or more particles on a substrate. In particular, the present invention provides a system and method to form one or more patterns of particles on a substrate. Typically, the particles are material for use in electronic, optical, biochemistry, sensory, and diagnostic applications and devices and are patterned on a semiconductor, polymeric or plastic substrate.

The present invention is a method of transferring dry or semi-dry particles onto a substrate. In one embodiment, the particles are nanoparticles. It is understood that the term "particles" is understood to mean one or more particles, and similarly the term "nanoparticles" is understood to mean one or more nanoparticles. As explained below in one embodiment, the nanoparticles have a mean particle diameter ("$D_{50}$") of less than about 1000 nm, typically less than about 950 nm, more typically less than 900 nm. Other D50 values are also contemplated. While reference herein is made primarily to nanoparticles, it is understood that the nanoparticles can be substituted with other-sized particles such as micro-particles. Micro-particles for purposes of this description are typically having a D50 of at most 100 micrometers, more typically a D50 of at most 25 micrometers.

Nanoparticles

Typically the nanoparticles of the present invention can utilized in dry form, which is understood to mean that the nanoparticles can have a moisture or solvent content of less than 3%, typically less than 2%, more typically less than 1% by weight of nanoparticles. In one embodiment, "dry" nanoparticles means nanoparticles having moisture or solvent content of less than 0.9% by weight nanoparticles. In another embodiment, "dry" nanoparticles means nanoparticles having moisture or solvent content of less than 0.8% by weight nanoparticles, typically less than 0.7% be weight. In another embodiment, "dry" nanoparticles means nanoparticles having moisture or solvent content of less than 0.5% by weight nanoparticles, typically less than 0.3% by weight, more typically less than 0.2% by weight. In yet another embodiment, "dry" nanoparticles means nanoparticles having moisture or solvent content of less than 0.1% by weight nanoparticles, typically less than 0.05% by weight nanoparticles.

The nanoparticles can also be utilized in semi-dry form, which is understood to mean that the nanoparticles can have a moisture or solvent content of less than 15%, typically less than 13%, more typically less than 10% by weight of nanoparticles. In one embodiment, "semi-dry" nanoparticles means nanoparticles having moisture or solvent content of less than 9% by weight nanoparticles. In another embodiment, "semi-dry" nanoparticles means nanoparticles having moisture or solvent content of less than 8% by weight nanoparticles, typically less than 7% be weight. In another embodiment, "semi-dry" nanoparticles means nanoparticles having moisture or solvent content of less than 0.5% by weight nanoparticles, typically less than 0.3% by weight, more typically less than 0.2% by weight. In yet another embodiment, "dry" nanoparticles means nanoparticles having moisture or solvent content of less than 0.1% by weight nanoparticles, typically less than 0.05% by weight nanoparticles. Typically the nanoparticles in this dry or semi-dry form may not be dispersed in solution.

The nanoparticles are selected from the group consisting of a noble-metal, metallic, magnetic, mineral, conductive material, a semi-conductive material, a dielectric material and any combination thereof. The nanoparticles may be applied as colloids solutions selected from the group consisting of a noble-metal, metallic, magnetic, mineral, conductive material, a semi-conductive material, a dielectric material and any combination thereof.

In one embodiment, the nanoparticles comprise silver, gold, copper, cadmium, palladium, metal complexes, metal alloys, silica, metal oxides, indium-tin oxide, iron oxide, silicon oxide, silicon, germanium, gallium arsenide, zinc oxide, zinc selenide, rare earth metal oxides, cerium oxide, and any combination thereof. In another embodiment, the nanoparticles utilized in the present invention comprise silica nanoparticles. In another embodiment, the nanoparticles are chosen from any suitable noble-metal, metallic, magnetic, mineral, conductive material, semi-conductive material, dielectric material or any combination thereof.

When coated on a donor substrate, the nanoparticles can be dispersed in solution or solvent, in a form of a colloid solution. The nanoparticles are then allowed to dry through evaporation or other means to remove the solvent or water. However, when transferred to the elastomeric stamp, as used in the present invention, such particles will be in dry or substantially dry form. It is thus understood that the nanoparticles can be in colloid solution when coated (e.g., spin coated, pouring, liquid casting, jetting, immersion, spraying) onto a donor substrate, the colloid solution being one incorporating a noble-metal, metallic, magnetic, mineral, conductive material, a semi-conductive material, a dielectric material, silver, gold, copper, cadmium, palladium, metal complexes, metal alloys, silica, metal oxides, indium-tin oxide, silicon, germanium, gallium arsenide, zinc oxide, zinc selenide, any of the material described herein or any combination thereof.

Other examples of materials that may be utilized as particles or nanoparticles of the present invention include, but are not limited to biological molecules, semi-conducting molecules, pharmacologically active compounds, biologically active compounds, compounds having catalytic actives, alone or in various combinations with other particles as described herein, and which are suitable for placement on patterned electronic, sensory or optical applications or devices. Biologically active materials can include, but are not limited to, deoxyribonucleic acids (DNAs), proteins, poly(oligo)peptides, and poly(oligo)saccharides.

In one embodiment, the nanoparticles have a mean particle diameter ("$D_{50}$") of less than about 1000 nm, typically less than about 950 nm, more typically less than 900 nm. In a second embodiment, the nanoparticles have a $D_{50}$ of less than about 800 nm, typically less than 750 nm, more typically less than 700 nm. In another embodiment, the nanoparticles have a $D_{50}$ of less than about 600 nm, more typically less than about 550 nm. In another embodiment, the nanoparticles of the present invention have a $D_{50}$ of less than about 500 nm, more typically less than about 450 nm. In another further embodiment, the nanoparticles have a $D_{50}$ of less than about 400 nm, typically, less than about 300 nm, more typically less than 250 nm. In another embodiment, the nanoparticles have a $D_{50}$ of less than about 200 nm. In yet another embodiment, the nanoparticles have a $D_{50}$ of less than about 100 nm. In yet another embodiment, the nanoparticles have a $D_{50}$ of less than about 90 nm. In a further embodiment, the nanoparticles have a $D_{50}$ of less than about 75 nm. In yet another embodiment, the nanoparticles have a $D_{50}$ of less than about 65 nm. In another further embodiment, the nanoparticles have a $D_{50}$ of less than about 50 nm. In another embodiment, the nanoparticles have a $D_{50}$ of less than about 25 nm. In yet another embodiment, the nanoparticles have a $D_{50}$ of less than about 15 nm. In a further embodiment, the nanoparticles have a $D_{50}$ of less than about 5 nm.

The functional material is typically not dispersed or dissolved or suspended in a liquid, such as water, or a solvent or carrier agent. Solvents are generally considered aids to help the particles to wet a substrate that is desired to be coated by the particles. The solvent generally is one or a mixture of solvents, which acts as dispersing agents, that is a substance which is capable of dissolving another substance (i.e., functional material) to form a uniform mixture. Carrier agents are likewise capable of dispersing or suspending the material in solution. Solvents can generally include known solvents such as ethanol, isopropanol, tetrahydrofuran, chloroform, acetonitrile, toluene and hexane, among others, or any other solvent that would be apparent to one of ordinary sill in the art for use in microcontact printing techniques.

Generally, in the prior art, particles are present in the liquid, solvent or carrier from about 0.01% to about 50% based on total weight of the composition, depending on the type of application and other specific variables. The resulting composition is applied to the stamp by applying it to the raised surface of the relief structure of the stamp. The composition of liquid, solvent, and/or carrier with the suspended particles are traditionally applied to the stamp by methods in the art such as vapor deposition, pouring, casting, jetting, immersion, spraying, and coating such as spin coating, dip coating, and slot coating.

However, it has been surprisingly discovered in the process and systems of the present invention that no such liquid or carrier or solvent is needed to facilitate the transfer of nanoparticles from the elastomeric stamp to a receiver substrate, which is desirable from an efficiency standpoint and a cost-effectiveness standpoint.

FIG. 1 shows a schematic representation of a prior art procedure for microcontact printing of colloids from Hidber et al, Microcontact Printing of Palladium Colloids Micron-Scale Patterning by Electroless Deposition of Copper, Langmuir 1996, 12, pp. 1375-1380. The PDMS stamp was exposed to a solution containing Pd-colloid 12. After the stamp 10 was inked with the solution of palladium colloid 12, the stamp 10 was placed on the substrate that had been silanized with functional organosilanes 14 (adhesion promoter). The catalyst was transferred from the relief regions of the stamp 10 to the surface of the substrate 16. Stamping onto the pretreated substrate transfers the colloid to form a pattern. After the stamp 10 was removed the substrate 16 was immersed in Cu plating solution. Thus, Cu 18 is deposited. In particular there is selective electroless deposition of copper catalyzed by the deposited palladium colloids. Metallization occurred only where the substrate was activated with the palladium colloid.

Figure 2A:
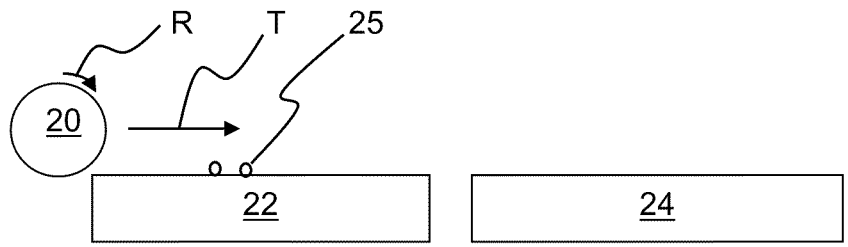
FIG. 2A shows a schematic of a first step of an embodiment of the present method.

FIG. 2A shows a schematic of a first step of an embodiment of the present method in which the roller 20 rotates in a direction R and moves transversely in a direction of travel T onto a donor substrate 22 with a layer of nanoparticles 25 (only two nanoparticles are shown to simplify the drawing). FIG. 2A shows the roller 20 is cylindrical. The roller 20 can be made to have a surface layer of a material for accepting the nanoparticles with an underlying cylinder of another material to support the surface layer or the roller can be a homogeneous roller made entirely of the material for accepting the nanoparticles. FIG. 2A shows a solid roller. However, although not shown the roller may be hollow with a surface of a material for accepting the nanoparticles.

Figure 2B:
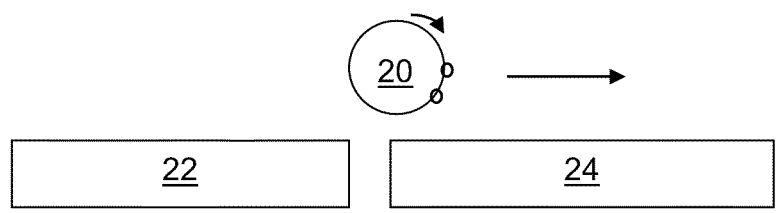
FIG. 2B shows a schematic of a second step of an embodiment of the present method.

FIG. 2B shows a schematic of a second step of an embodiment of the present method in which the nanoparticles 25 have been transferred from the donor substrate 22 to the roller 20 which is rolling towards the receiver substrate 24.

Figure 2C:
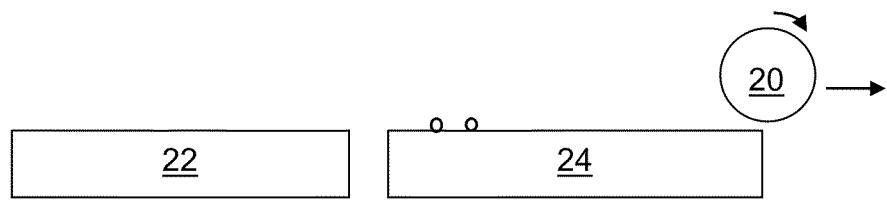
FIG. 2C shows a schematic of a third step of an embodiment of the present method.

FIG. 2C shows a schematic of a third step of an embodiment of the present method in which the roller 20 rolling upon the receiver substrate has deposited the nanoparticles 25 onto the receiver substrate.

Figure 2D:
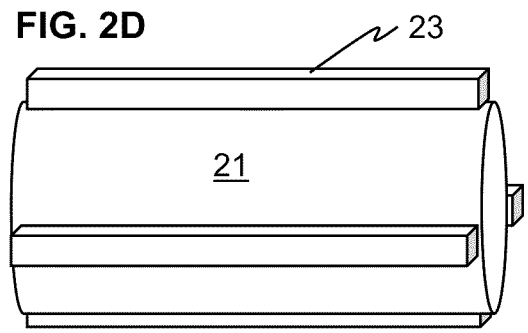
FIGS. 2D and 2E show perspective and side views, respectively, of a schematic drawing of a roller having idealized projections.
Figure 2E:
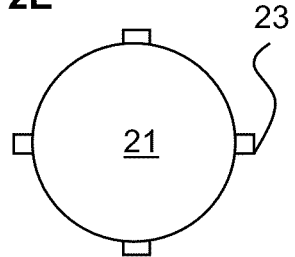

FIGS. 2D and 2E show perspective and side views of a roller having projections 23. Projections 23 on roller 21 are idealized representations of the patterns which may be formed on the surface of the roller 21 by various regular shapes or irregular shapes. For example, a coating of wrinkled PDMS (not shown) on the roller may form wrinkled shapes on the roller surface.

Figure 3:
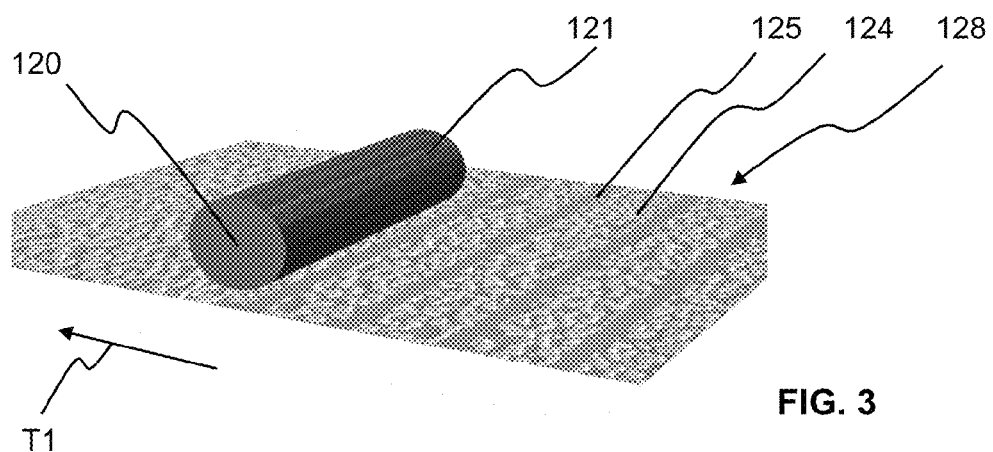
FIG. 3 shows a schematic illustration of the rolling process used in this work: A layer of wrinkled PDMS is wrapped onto a cylindrical roller and rolled (from right to left) on a flat substrate covered with nanoparticles.

FIG. 3 shows a schematic illustration of an embodiment of the rolling process of the invention. A wrinkled substrate 121 is wrapped onto a cylindrical roller 120 and rolled (from right to left) along direction T1 on a flat donor substrate 128 covered with nanoparticles 124 this results in empty spaces 125 on the surface the donor substrate 128.

Figure 4:
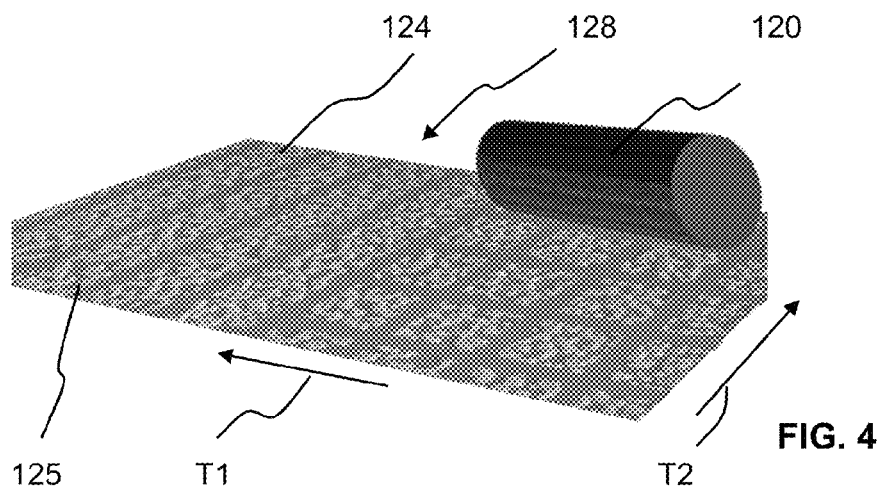
FIG. 4 shows a schematic illustration of the rolling process wherein on the left side the roller is rolled in a first direction on a donor substrate front to back, and on the right side the roller is rolled on the donor substrate in the first direction from front to back and in a second direction from right to left.

FIG. 4 shows a schematic illustration of another embodiment of the rolling process. On the left side the roller 120 is rolled on donor substrate 128 in first direction T1 from right to left to leave a set of generally parallel empty spaces from which nanoparticles were removed. On the right side the roller 121 is rolled on the donor substrate 128 in the first direction T1 from right to left and in a second direction T2 from front to back to leave a grid of empty spaces.

Figure 5:
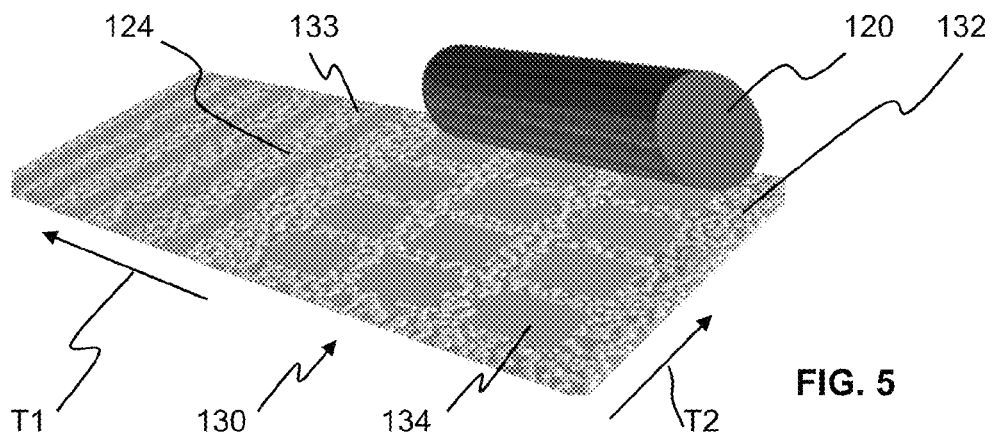
FIG. 5 shows rolling the roller on a receiver substrate wherein on the left side the roller is rolled in a first direction on the receiver substrate from front to back to deposit lines of particles, and on the right side the roller is rolled on the receiver substrate in the first direction from front to back and in a second direction from right to left to deposit a grid of particles.

FIG. 5 shows a schematic illustration of rolling the roller 121 on a receiver substrate 130. On the left side of the receiver substrate 130 the roller 120 is rolled in first direction T1 from right to left to deposit lines 133 of particles 124. On the right side of the receiver substrate 130 the roller 121 is rolled in first direction T1 from right to left on the receiver substrate 130 and in a second direction T2 from front to back to deposit a grid 132 of particles 124 with remaining blank spots of uncovered substrate surface.

In one embodiment, the method of the present invention comprises the step of providing a roller comprising a stamp, typically an elastomeric stamp. The roller can be made of any suitable material including metal, plastic, rubber and the like. The roller is typically cylindrical, but it understood that the roller can be any shape that has a smooth or semi-smooth continuous surface that can be utilized to pattern a receiver substrate, such as circular, semi-circular, oblong, and the like.

The method of the present invention employs a stamp, typically an elastomeric stamp. Elastomeric stamps for use with the present invention comprise a flexible, semi-flexible or semi-rigid material having a surface that incorporates a topographical pattern.

Stamp Materials

Typical materials for use as stamps can undergo elastic deformation and compression in response to an external force. Not being bound by any particular theory, the flexibility of an elastomeric stamp can help to ensure that conformal contact is achieved between a patterned surface of a stamp and a surface of a substrate. In some embodiments, the elastomeric stamp for use with the present invention has a Young's modulus of about 1 MPa to about 5,000 MPa. In some embodiments, a stamp for use with the present invention has a maximum Young's modulus of about 4,000 MPa, about 2,000 MPa, about 1,500 MPa, about 1200 MPa, about 1000 MPa, about 800 MPa, about 600 MPa, about 400 MPa, about 200 MPa, about 100 MPa, about 80 MPa, about 60 MPa, about 40 MPa, or about 20 MPa. In some embodiments, the elastomeric stamp for use with the present invention has a minimum Young's modulus of about 1 MPa, about 2 MPa, about 3 MPa, about 5 MPa, about 7 MPa, about 10 MPa, about 15 MPa, or about 20 MPa.

More typically, the elastomeric stamp for use with the present invention has a Young's modulus of about 0.1 MPa to about 500 MPa In some embodiments, a stamp for use with the present invention has a maximum Young's modulus of about 400 MPa, about 200 MPa, about 150 MPa, about 120 MPa, about 100 MPa, about 80 MPa, about 60 MPa, about 40 MPa, about 20 MPa, about 10 MPa, about 8 MPa, about 6 MPa, about 4 MPa, or about 2 MPa. In some embodiments, the elastomeric stamp for use with the present invention has a minimum Young's modulus of about 0.1 MPa, about 0.2 MPa, about 0.3 MPa, about 0.5 MPa, about 0.7 MPa, about 1 MPa, about 1.5 MPa, or about 2.0 MPa.

In some embodiments, the Young's modulus of the elastomeric stamp can be varied along the length or width of the elastomeric stamp to optimize the patterning process. For example, as the lateral dimensions of any desired pattern decrease, the Young's Modulus of a stamp can increase to ensure that the lateral dimensions of the stamp are transferred to the patterned substrate without distortion.

Another parameter useful for the elastomeric material is its Shore A durometer value. Typical elastomeric materials have a Shore A durometer value in the range from about 30 to 80, typically about 45 to 55, for example 50.

The material for the elastomeric stamp is typically selected from the group consisting of epoxy polymers, polyisoprene polymers, polyurethane polymers, polyimide polymers, polybutadiene polymers, polyvinylchloride, polyethylene, polystyrene polymers, and acrylate polymers, silicone polymers and combinations thereof.

The stamp may also be fabricated from a composite material having a filler dispersed in a polymeric matrix. Fillers may be employed to adjust the mechanical, optical, thermal, or magnetic properties of the stamp material. Typical fillers include silica particles, titania particles, and other metal oxide particles, as well as carbon black, or carbon powders.

The materials suitable for use as, as part of or with the elastomeric stamps of the present invention include, but are not limited to, epoxy polymers, polyurethane polymers, polyimide polymers, polyvinylchloride, polyethylene, polystyrene polymers, and acrylate polymers, silicone polymers, poly(dimethylsiloxane), poly(silsesquioxane), poly(isoprene) polymers, poly(butadiene) polymers, styrene-butadiene copolymers, polychloroprene, natural rubbers, butyl rubbers, halogenated butyl rubbers, nitrile rubbers, an ethylene-propylene rubbers, a polyacrylic rubber, a silicone rubber, fluorosilicone rubbers, a tetrafluoro ethylene/propylene rubbers, fluoroelastomer, perfluoroelastomer, teflon, a chlorosulfonated polyethylene, an ethylene vinyl acetate, polycarbonate polymers, polyolefin polymers, cellulosic materials such as triacetyl cellulose, polyethylene terephthalate, polyethylene napthalate and combinations thereof. Preferably the elastomeric material is PDMS (poly(dimethylsiloxane)). PDMS is a commercially available type of silicon rubber.

PDMS belongs to a group of polymeric organosilicon or silicon based organic polymercompounds referred to as silicones In one embodiment, the materials suitable as, as part of or with the elastomeric stamp comprise epoxy polymers, polyisoprene polymers, polyurethane polymers, polyimide polymers, polybutadiene polymers, polyvinylchloride, polyethylene, polystyrene polymers, and acrylate polymers, silicone polymers or combinations thereof. In another embodiment, the elastomeric stamp comprises poly(dimethylsiloxane).

The stamp may be cured by irradiation (exposure to radiation), heating, a combination thereof, or by other methods known in the art. The stamp in one embodiment can include a layer of the elastomeric material on top of a layer of a second material. The second material can be elastomeric or non-elastomeric, depending on the desired application. The stamp can be created by, in one embodiment, engraving a material in a manner that generates the relief structure. In another embodiment, the stamp can be generated by ablating a material in a similar manner.

Stamp Patterns

A stamp, and in particular, elastomeric stamp, for use with the present invention comprises a surface having at least one indentation therein, i.e., relief structure, the indentation defining a pattern in the surface of the stamp. A pattern refers to one or more features capable of being formed on any receiver substrate. A stamp having a topographical pattern can be prepared in any number of ways. In one embodiment the stamp is prepared by mechanical stretching of the elastomer, e.g, PDMS, followed by $O_2$ plasma treatment or UVO (ultraviolet ozone) treatment. In another embodiment, the stamp is prepared from a master comprising a topographical pattern in the surface of a rigid or semi-rigid material, composite, and the like.

A pattern can include both positive and/or negative images (hereinafter sometimes referred to as "positive" or "negative", respectively) formed on a surface, typically of a receiver substrate, of a feature or features in the surface of a stamp. It is understood that a pattern can refer to one or more features capable of being formed on any receiver substrate, but not necessarily utilized to form an image on a receiver substrate. In some embodiments, the pattern formed on a receiver substrate comprises a monolayer. In some embodiments, the pattern formed on a flexible receiver substrate comprises a thin film.

The layer of nanoparticles on the stamp can be continuous or discrete. The thickness of the layer of the composition is not particularly limited. In one embodiment, the thickness of the composition layer is typically less than the relief height (difference between the raised surface and the recessed surface) of the stamp. If discrete particles, then, the particles are side-by-side particles in contact or separated from each other, as opposed to a continuous phase.

In some embodiments, a pattern can be defined by its physical dimensions, which have at least one lateral dimension. As used herein, a lateral dimension refers to a dimension of a pattern that lies in the plane of a receiver substrate. One or more lateral dimensions of a pattern define the area of a substrate that a pattern occupies. Typical lateral dimensions of patterns include, but are not limited to: length, width, radius, diameter, and combinations thereof. In some embodiments, a pattern formed on a receiver substrate by the systems and methods of the present invention has at least one lateral dimension of about 10 micrometer or less. In one embodiment, a pattern formed on a receiver substrate by the systems and methods of the present invention has at least one lateral dimension of about 5 micrometer or less. In one embodiment, a pattern formed on a receiver substrate by the systems and methods of the present invention has at least one lateral dimension of about 1000 nanometers or less. In one embodiment, a pattern formed on a receiver substrate by the systems and methods of the present invention has at least one lateral dimension of about 750 nanometers, more typically about 500 nanometers or less. In one embodiment, a pattern formed on a receiver substrate by the systems and methods of the present invention has at least one lateral dimension of about 100 nanometers or less. In one embodiment, a pattern formed on a receiver substrate by the systems and methods of the present invention has at least one lateral dimension of about 75 nanometers. In one embodiment, a pattern formed on a receiver substrate by the systems and methods of the present invention has at least one lateral dimension of about 50 nanometers or less. In one embodiment, a pattern formed on a receiver substrate by the systems and methods of the present invention has at least one lateral dimension of about 15 nanometers or less.

Patterns formed on a receiver substrate by the process or apparatus of the present invention include, but are not limited to, structural patterns, etched patterns, conductive patterns, semi-conductive patterns, dielectric or insulating patterns and masking patterns.

Substrates

In accordance with the present invention, a substrate material is provided to which a desired pattern is imparted by the stamp. The substrate of the present invention may be any suitable electrically conductive, electrically non-conductive, or electrically semi-conductive material that can form a solid phase at room temperature. The substrate may include, for example, a metallic film on a polymeric, glass, or ceramic substrate, a metallic film on a conductive film(s) on a polymeric substrate, metallic film(s) on semiconducting film(s) on a polymeric substrate, or multi-layered substrates with an outer layer capable of forming and supporting a layer of nanoparticles, for example a monolayer of nanoparticles. The invention can form monolayers, typically from a single pass of a roller. However, the invention can form multilayers, typically by performing multiple passes of one or more rollers.

In one embodiment, the receiver substrate is any suitable material including but not limited to plastic, polymeric films, metal, silicon, glass, fabric, paper, and combinations thereof, and can be rigid, flexible, opaque, transparent, etc. In one embodiment, the receiver substrate is substantially flat. In other embodiments, the receiver substrate is a non-planar substrate, i.e., a substrate that is not substantially flat. Examples of non-planar substrates include but are not limited to curved objects such as spheres or globes, where a pattern of semi-conductive nanoparticles are desired to be placed upon.

Suitable substrates include, for example, a metallic film on a polymeric, glass, or ceramic substrate, a metallic film on a conductive film or films on a polymeric substrate, metallic film on a semiconducting film on a polymeric substrate. Further examples of suitable substrates include, for example, glass, indium-tin-oxide coated glass, indium-tin-oxide coated polymeric films; polyethylene terephthalate, polyethylene naphthalate, polyimides, silicon, and metal foils. The substrate can include one or more charge injection layers, charge transporting layers, and semiconducting layers on to which the pattern is transferred.

Methods

The method of the present invention comprises transferring nanoparticles in a dry or semi-dry state from the donor substrate onto the elastomeric stamp. In one embodiment, the nanoparticles form a thin layer on the surface of the donor substrate prior to the transfer of the nanoparticles onto the elastomeric stamp on the roller. In some embodiments, the nanoparticles are applied as colloid solutions to the donor substrate, i.e., compositions of liquid, solvent, and/or carrier with suspended or dispersed nanoparticles. These can be applied to the donor substrate utilizing methods such as vapor deposition, pouring, casting, jetting, immersion, spraying, and coating such as spin coating, dip coating, and slot coating. The liquid, solvent, and/or carrier is then allowed to evaporate or is forcibly removed from the composition, through forced air drying, application of heat, etc., substantially leaving the nanoparticles on the surface of the donor substrate. In one embodiment, the nanoparticles form a monolayer of thickness of less than 100 nanometers, or in other embodiment, a thickness of less than 80 nanometers, or in other embodiment, a thickness of less than 50 nanometers, or in other embodiment, a thickness of less than 25 nanometers, or in other embodiment, a thickness of less than 15 nanometers. In another embodiment a multilayer is formed.

The transfer (of nanoparticles from the donor substrate to the elastomeric stamp) is achieved through the application of force by rolling the roller and elastomeric stamp over the donor substrate such that the elastomeric stamp contacts the nanoparticles on the donor substrate surface. The donor substrate can be any suitable material including but not limited to polymer, metal, silicon, glass, fabric, paper, and combinations thereof. The substrate can be rigid or flexible. In one embodiment, the donor substrate is a substantially flat silicon substrate.

The particles are transferred to and from PDMS by adhesion. This adhesion can be enhanced by slightly exposing the PDMS surface to $O_2$ plasma, that makes the PDMS hydrophilic and the adhesion to silica nanoparticles easier. While not being limited to theory, one form of adhesion for particles in the present invention may be adsorption.

The elastomeric stamp in a next step includes depositing the dry or semi-dry nanoparticles from the elastomeric stamp onto a receiver substrate by imparting force, by for example, rolling the elastomeric stamp onto the receiver substrate.

As mentioned above, in one embodiment, the receiver substrate is any suitable material including but not limited to plastic, polymeric films, metal, silicon, glass, fabric, paper, and combinations thereof, and can be rigid, flexible, opaque, transparent, etc. In one embodiment, the receiver substrate is substantially flat. In other embodiments, the receiver substrate is a non-planar substrate, i.e., a substrate that is not substantially flat. Examples of non-planar substrates include but are not limited to curved objects such as spheres or globes, where a pattern of semi-conductive nanoparticles are desired to be placed upon.

In another embodiment, the receiver substrate may include one or more layers and/or one or more patterns of other materials, before the pattern of the functional material according to the present method is formed on the substrate. For example, the receiver substrate can have a second relief structure. The second relief structure can have the same pattern as the elastomeric stamp pattern used in connection therewith, or can have a different pattern. Thus, in such an embodiment, by rolling the elastomeric stamp in a certain predetermined direction, e.g., perpendicular relative to the pattern of the receiver substrate and its relief structure, an entirely different pattern can be formed on the receiver substrate. That is, the resulting pattern is not the same as the first pattern corresponding to the elastomeric stamp, and is likewise not the same as the second pattern corresponding to the receiver substrate. The predetermined direction can be any desired direction of the elastomeric stamp pattern rolled relative to the receiver substrate pattern. In one embodiment, the predetermined direction of rolling the elastomeric stamp is less than 180 degrees relative to the receiver substrate pattern, in another embodiment, is less than 120 degrees relative, in another embodiment, less than 100 degrees relative, in another embodiment, less than 90 degrees relative, in another embodiment, less than 75 degrees relative, in another embodiment, less than 45 degrees relative, in another embodiment, less than 25 degrees relative, in another embodiment, less than 10 degrees relative.

In some embodiments, the surface of the receiver substrate can include a surface with adhesion-promoting characteristics, which can include a primer layer. The surface can also be treated thus promoting adhesion of an adhesive layer or the nanoparticles material to the substrate. Optionally, the substrate can include an adhesive layer to aid in the transfer of the functional material from the elastomeric stamp to the substrate.

As mentioned above, suitable substrates include, for example, a metallic film on a polymeric, glass, or ceramic substrate, a metallic film on a conductive film or films on a polymeric substrate, metallic film on a semiconducting film on a polymeric substrate. Further examples of suitable substrates include, for example, glass, indium-tin-oxide coated glass, indium-tin-oxide coated polymeric films; polyethylene terephthalate, polyethylene naphthalate, polyimides, silicon, and metal foils. The substrate can include one or more charge injection layers, charge transporting layers, and semiconducting layers on to which the pattern is transferred.

It is understood that the methods of the present invention can be repeated to place several different species of nanoparticles on one receiver substrate. For example, a roller can deposit a pattern of dielectric nanoparticles on a receiver substrate, followed by a pattern of semi-conductive or conductive nanoparticles on the receiver substrate. The method can involve one or several donor substrate and one or several rollers having elastomeric stamps. The elastomeric stamps can have the same or different structures.

In some embodiments, the present invention is a method of patterning a substrate (which in some cases is analogous to the donor substrate) by first forming a thin film of nanoparticles on the substrate surface. The layer of nanoparticles can be any of the desired thicknesses as described herein or can be a layer one or several nanometer molecules in height. The nanoparticles can be applied as colloid solutions to the substrate by utilizing method such as vapor deposition, pouring, casting, jetting, immersion, spraying, and coating such as spin coating, dip coating, and slot coating. Then the colloid solution film is allowed to dry, leaving a layer of dry or semi-dry nanoparticles coating the substrate. In one embodiment, the nanoparticles uniformly coat the substrate, while in other embodiments the nanoparticles coat the substrate by forming one or more contiguous areas of layers on the substrate. Once the nanoparticles coat the surface in dry or semi-dry form, the substrate (which can sometimes serve as the donor substrate) can be patterned by rolling a roller with an elastomeric stamp having a relief structure. By rolling the elastomeric stamp, a negative of the relief structure is formed on the substrate. (In some cases, the roller can then be utilized to transfer the removed nanoparticles to a desired receiver substrate.) That is, the nanoparticles that remain on the substrate form a negative or opposite pattern of the relief structure pattern. This pattern can serve as a pattern of dielectric, semi-conductive or conductive nanoparticles on a substrate that can be utilized in connection with microelectric devices, optics, sensors and biochemical sensors, among others.

As already described above, the present invention utilizes micro contact printing in the pattern transfer of nanoparticles. The present invention is economically efficient and viable. It is based, in some embodiments, on a pattern transfer of colloids, as well as a process of loading/transferring nanoparticles.

In one particular embodiment, the method of the present invention is based on a cylindrical roller on which an elastomeric stamp is placed, on a temporary (e.g., temporary adhesive) or permanent. Silica nanoparticles can be removed from a flat donor substrate, picked up by a roller having an elastomeric stamp, and subsequently transferred to another receiver substrate. In some embodiments, the donor substrate and/or elastomeric stamp can be used several times. The nanoparticles can be stamped on several receiver substrates.

A key factor determinative of a complete pattern transfer from donor substrate to the roller and from the roller to the receiver substrate may be the uniformity of pressure exerted on the roller (and/or the substrate) Pressure distribution across the roller surface may be substantially uniform so any applied force enabling stamp/substrate contact does not favor one localized region of the contact surface over another Another key factor may be the force applied to the roller and/or substrate. Too much force will promote unacceptable levels of roller and/or substrate deformation (and inaccurate, low resolution pattern transfer), and too little force will prevent a complete pattern transfer.

Contact time between the substrate and roller is dependent upon, among other things, the physical properties of the nanoparticles, the substrates, the roller surface, relief structure and the desired resolution.

This process resolves some problems of the prior art in printing fine lines or small-scale of patterns (i.e., no need for any surface modification, or controlled adhesion etc). The process is faster than those used with other techniques; it is also low cost, simple and easy to use. In one embodiment, the method of transferring dry or semi-dry nanoparticles onto the substrate takes less than 10 seconds, or takes less than 9 seconds or takes less than 5 seconds. In one embodiment, the method of transferring dry or semi-dry nanoparticles onto the substrate takes less than 5 seconds, more typically less than 4 seconds. In one embodiment, the method of transferring dry or semi-dry nanoparticles onto the substrate takes less than 1 second, more typically less than 0.5 seconds. In one embodiment, the method of transferring dry or semi-dry nanoparticles onto the substrate takes less than 0.25 seconds, more typically less than 0.1 seconds. The technique can be applied in different technologies (i.e. microelectronics without any need of glue or adhesive). It can be done at room temperature under the lab conditions without the need to a clean room. The nanoparticles utilized in the methods of the present invention can adhere to the relief structure of the elastomeric stamp and could be transferred to a receiver substrate through rolling resulting in 1D line patterns of nanoparticles. By rolling in different directions, a 2D grid pattern of nanoparticles can be formed, as described above. Typical times for a roller to apply the pattern are 0.1 seconds (or less) per cm of length in the direction of roller travel (see for example direction of roller travel T in FIG. 2A) of the substrate being contacted. A typical rotational speed of the roller is 35 cm/second or more, for example 30-100 cm/second or 35-80 cm/second. For example, as mentioned below the substrate of an example was 4 cm×1.5 cm and the roller of the example was rotated at about 35 cm/sec, so this leads to a rate of time for coverage of about 0.1 s/cm.

The particles are transferred to and from PDMS by adhesion. This adhesion can be enhanced by slightly exposing the PDMS surface to $O_2$ plasma, that makes the PDMS hydrophilic and the adhesion to silica nanoparticles easier. In at least some embodiments the adhesion is by adsorption. However, if desired, the receiver substrate may be provided with adhesive to retain the deposited particles.

The process of the present invention may further include post-stamping process steps. For example, the substrate may further be subjected to post-processing such as etching (or orthogonal etching), as readily understood and practiced by those skilled in the art. However, an advantage of the present process is that it can result in useful patterns without etching. Etching is useful, for example, to etch away excess metallic particles on a silicon substrate. However, an advantage of the present invention is that it can deposit a desired copper pattern directly. Thus, there is no need to etch because the pattern is directly formed. However, etching can be useful when there are layers of SAMs formed by a roller and underneath there is a metallic film of conductor, copper for example. In this case, it may be useful to etch the area not covered by the SAMs. In this case the SAMs protect the underlying metallic layer and the unprotected portion of the layer dissolves or is etched by the etchant, to form different patterns.

Examples of metal etchants include:

Gold Etchants

1. Aqueous solution of $Fe(CN)_6^{-3}/Fe(CN)_6^{-3}/S_2O_3^{-2}$ (0.1M/0.01M/0.1M) in 1M KOH
2. $CN^-/O_2$ solution
3. (For use with GaAs substrate): 10:1:1 (v:v:v) of 5% (w/v) thiourea, 15% (v:v) $H_2O_2$ and 6N HCl at 35 degrees C.

Silver Etchant

1. $Fe(CN)_6^{-3}/Fe(CN)_6^{-3}/S_2O_3^{-2}$ (0.1M/0.01M/0.1M) (aqueous solution)

Aluminum Etchants

1. TRASENE Aluminum etchant type "A" (commercially available)
2. Phosphoric acid/acetic acid/nitric acid/water (16:1:1:2)

Copper Etchant

1. $FeCl_3$ (0.012 M)
2. $FeCl_3$ (0.012 M) and HCl (0.4-0.8 M)
3. $FeCl_3$ (0.012 M) and $NH_4Cl$ (0.4-0.8 M A selected etching process is dependent upon the substrate surface material not protected by SAMs. Additionally, before or after etching, the receiver substrate may be subjected to an additional rolling step (or steps) wherein the same roller is contacted with the receiver substrate or a different roller bearing a different pattern, is contacted with the substrate. It is further contemplated that post-stamping processes may include additive processes, wherein material is deposited onto the areas of the receiver substrate having already received a pattern, areas of the substrate which had not already received a pattern, or both.

The process of the invention may be carried out in a serial, batch, or continuous mode. In the serial mode, one substrate is processed at a time. In the batch mode, each process step is carried out on more than one substrate at a time. In the continuous mode, process steps are continuously executed on a continuous "supply" of substrate.

Following the rolling process, the receiver substrate may be inspected for quality assurance and quality control purposes. This may be accomplished visually (via microscopy, such as scanning electron microscopy and chemical atomic force microscopy), via test metrology, etc. Continuity testing (electrical) may be undertaken for quality assurance purposes. Optical integrity testing includes tests for substrate reflectivity, transparency, ellipsometry, (if the substrate is transparent) surface plasmon resonance, etc. Quality assurance may be tested, for example, via camera (CCD) imaging, contact angle determination, microscopy, etc.

During the application of the nanoparticles to the donor substrate, the transfer of the nanoparticles to the roller, and the transfer of the nanoparticles to the receiver substrate and the post rolling stages the process environment may be controlled. Temperature affects the thermal expansion of PDMS, the rates of chemical reactions and the evaporation of solvent carrier. Humidity control may also be beneficial. The concentration of particulate matter in the air may affect the accuracy of the applied patterns and the rate at which defects occur. Further, the extent of apparatus vibration may affect the accuracy of the applied patterns and the rate at which defects occur.

Conventional methods may be employed to control environmental variables. Temperature control may be achieved by using, for example, resistive heating or cooling with refrigeration. Pressure may be controlled with positive or negative gas flow into or out of a sealed chamber. Humidifiers and/or dehumidifiers may be used to control humidity. Particulate contamination may be minimized by maintaining a cleanroom environment that incorporates air filtration and a sealed chamber. The process of the present invention may be carried out at ambient conditions of room temperature and atmospheric pressure. Alternatively, the process may be carried out at temperatures and pressures above or below ambient temperature and atmospheric pressure, if desired for the particular rolling process being carried out. Environmental regulation may be accomplished with sensors, actuators, and processors that provide closed-loop control over the environmental parameters.

EXAMPLES

Example 1

Figure 6:
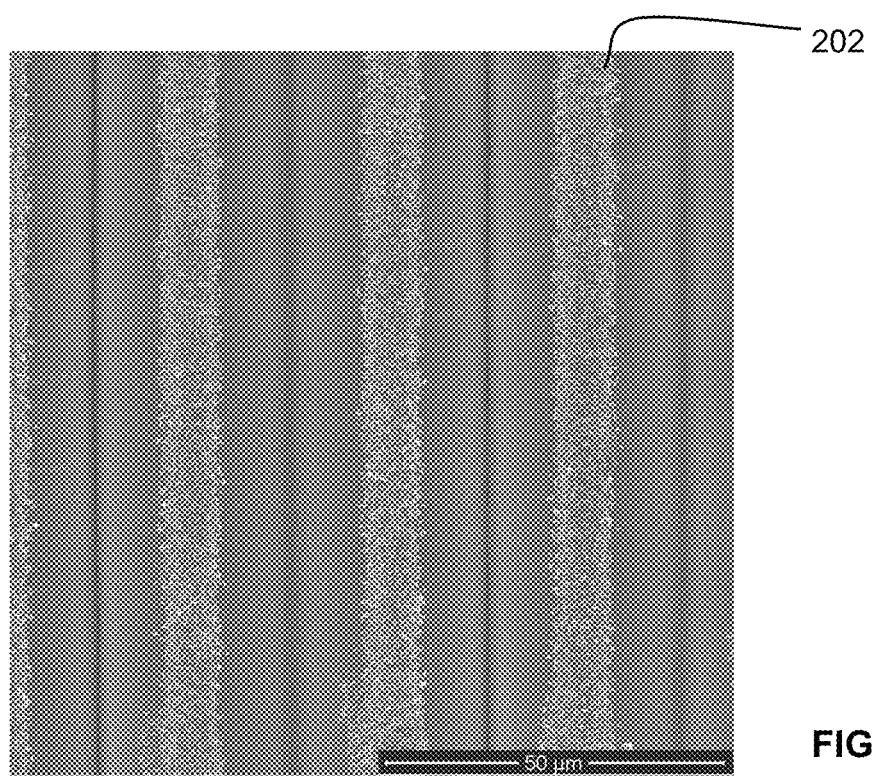
FIG. 6 shows an SEM image of the top of a wrinkled PDMS layer immobilized on a roller covered with rows of silica nanoparticles after rolling on a donor substrate.

FIG. 6 shows an SEM image of the top of a wrinkled PDMS layer immobilized on a roller. The wrinkled PDMS layer is covered with rows of silica nanoparticles 202 after rolling on a donor substrate. The PDMS layer was applied as the surface layer to a 3M MINI lint roller. The 3M lint roller has several adhesives sheets and this facilitates the adhesion of the PDMS layer as the surface layer of the roller. The donor substrate that led to the specimen in FIG. 6 was made as follows.

Step 1A—Preparing a Donor Substrate

A silicon wafer has been used as donor substrate, it was made by treating silicon wafers (p type semiconductor (100) from Wafer World Inc.) with a 5:1 $H_2SO_4:H_2O_2$ Piranha solution for 10 minutes, followed by a $O_2$ plasma treatment (HARRICK PLASMA, PDC-32G) for at least 3 minutes. The cleaned substrate was then subjected to a dip coating. For this, colloidal solutions (30 wt %) of silica nanoparticles (70-100 nm in diameter) in isopropanol (30% wt-IPA-ST-ZL from Nissan Chemical) were employed.

Although not exemplified, a PDMS donor substrate could be made by mixing PDMS (SYLGARD 184, Dow Corning) and a curing agent in a weight ratio of 10:1, followed by curing at 65° C. for 4 hrs. The water advancing contact angle on freshly prepared samples was 115°. Rectangular PDMS strips (40 mm×15 mm) were cut and exposed for at least 5 minutes to an $O_2$ plasma treatment (HARRICK PLASMA, PDC-32G) to rend the surface hydrophilic.

Step 1B—Preparing a Roller Surface Substrate (the Wrinkled PDMS Specimen of FIG. 6)

PDMS (SYLGARD 184, Dow Corning) and a curing agent were mixed in a weight ratio of 10:1, followed by curing at 65° C. for 4 hrs. Rectangular PDMS strips (40 mm×15 mm) were stretched uniaxially using a custom-designed stretching device to a certain strain (from 0 to 25%). The stretched samples were exposed to UVO cleaner (model 144AX, Jelight Company, Inc. utilizing ultraviolet and ozone) to generate a thin layer of oxide. Upon releasing of the strain, wrinkles were formed with wavelengths dependent on the applied strain, oxidation time and intensity. The time of exposure was varied between 20 min and 1 hour.

Although not exemplified, PDMS wrinkles can be prepared by exposing the stretched samples to $O_2$ plasma treatment (HARRICK PLASMA, PDC-32G). By this method wrinkles with lower wavelength than 118 can be formed and used.

Step 2—Selectively Depositing Colloidal Particles onto Donor Substrate

Colloidal solutions (30 wt %) of silica nanoparticles (70-100 nm) in isopropanol (30% wt-IPA-ST-ZL isopropanol available from Nissan Chemical America Corporation) were employed.

Nanoparticles were dip-coated onto flat PDMS films and/or silicon wafers to serve as "nanoparticle donor substrates". For dip coating, the silica nanoparticles were diluted in ethanol to 1 wt %. The particles were deposited using a dip coater (Nima Tech.) through a slow and vertical withdrawing from the solution at various speeds ranging from 10 mm/min to 30 mm/min. To minimize the hydrophobic recovery of PDMS films, the nanoparticles were dip-coated soon after the $O_2$ plasma exposure.

Step 3—Transfer Printing of Silica Nanoparticles from the Donor Substrate onto the PDMS Layer of the Roller To assemble the nanoparticles only on the PDMS ridges, the hydrophilic (UVO treated) wrinkled PDMS film (the "receiver substrate") was wrapped on a cylindrical lint roller (3M) coated with a thin layer of adhesive. This overall roller assembly was then rolled (0.1 cm/s) on a silicon wafer ("donor substrate") that had been dip-coated with nanoparticles to pick up the nanoparticles. The cylinder was rolled again on top of a second receiver substrate enabling the transfer/release of the nanoparticles as 1 dimensional line patterns matching the winkled template. 2 dimensional nanoparticles patterns were generated by repeating the above rolling and printing steps.

Step 4—Substrate Characterization

The samples were characterized by scanning electron microscopy (SEM). Images were taken with an FEI Strata DB325 focused ion beam (FIB) (PENN Regional Nanotechnology Facility, Philadelphia) in high vacuum mode with an acceleration voltage of 5 KV.

FIG. 6 shows SEM images of the top of wrinkled PDMS layer of the roller covered with silica nanoparticles 202 after rolling on a donor substrate. The PDMS layer was removed from the roller to enable taking the SEM photograph.

The tests showed silica nanoparticles (~100 nm or other nanoparticle sizes) could be removed from a donor substrate, picked up by a roller, and subsequently transferred to and assembled on the top of a wrinkled PDMS surface of a roller. The pattern size is 10 μm.

Example 2

Using the same procedure and materials as in Example 1 the silica nanoparticles were transferred onto the wrinkled PDMS surface immobilized on the roller. Then the roller was rolled in one predetermined direction on a flat PDMS receiver substrate.

The PDMS receiver substrate was made by mixing PDMS (SYLGARD 184, Dow Corning) and a curing agent in a weight ratio of 10:1, followed by curing at 65° C. for 4 hrs. The water advancing contact angle on freshly prepared samples was 115°. Rectangular PDMS strips (40 mm×15 mm) were cut and exposed for at least 5 minutes to an $O_2$ plasma treatment (HARRICK PLASMA, PDC-32G) to rend the surface hydrophilic.

Figure 7:
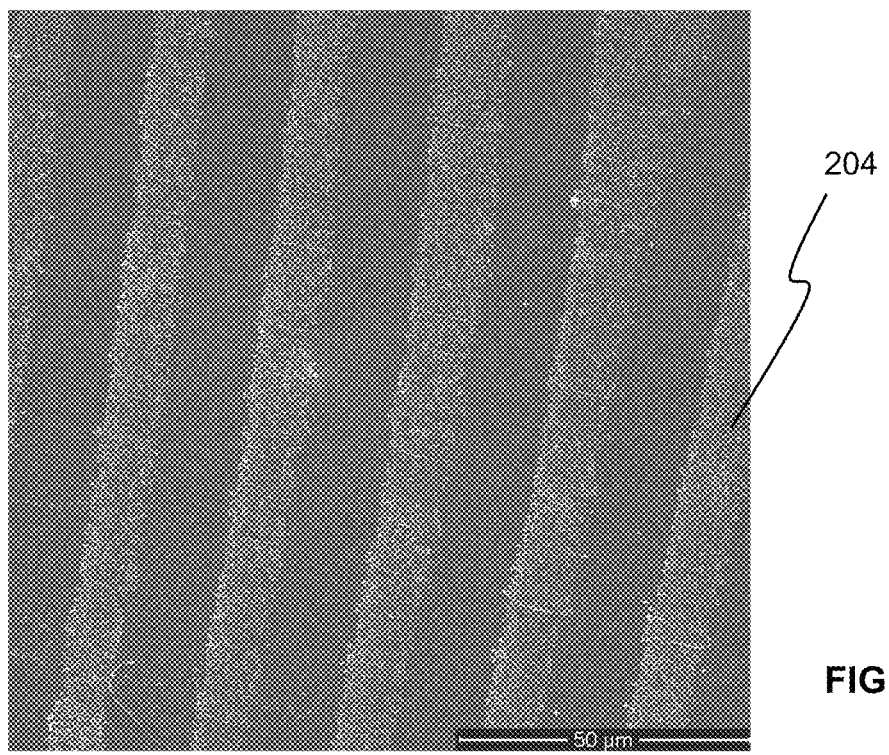
FIG. 7 shows an SEM image of silica patterns formed from rolling a wrinkled PDMS film covered with silica nanoparticles in only one direction on a receiver substrate.

FIG. 7 shows a SEM image of silica patterns formed on the product resulting from rolling the wrinkled PDMS film covered with silica nanoparticles 204 in the one predetermined direction on the flat PDMS receiver.

From this example it can be concluded a 1 dimensional pattern of nanoparticles (size ≦10 μm) can be formed Example 3

Using the same procedure and materials as in Example 2 the silica nanoparticles were transferred onto the wrinkled PDMS surface immobilized on the roller. Then the roller was rolled onto a PDMS flat receiver substrate in a first direction. Then the roller was rolled onto the same receiver substrate in a second direction orthogonal to the first direction.

Figure 8:
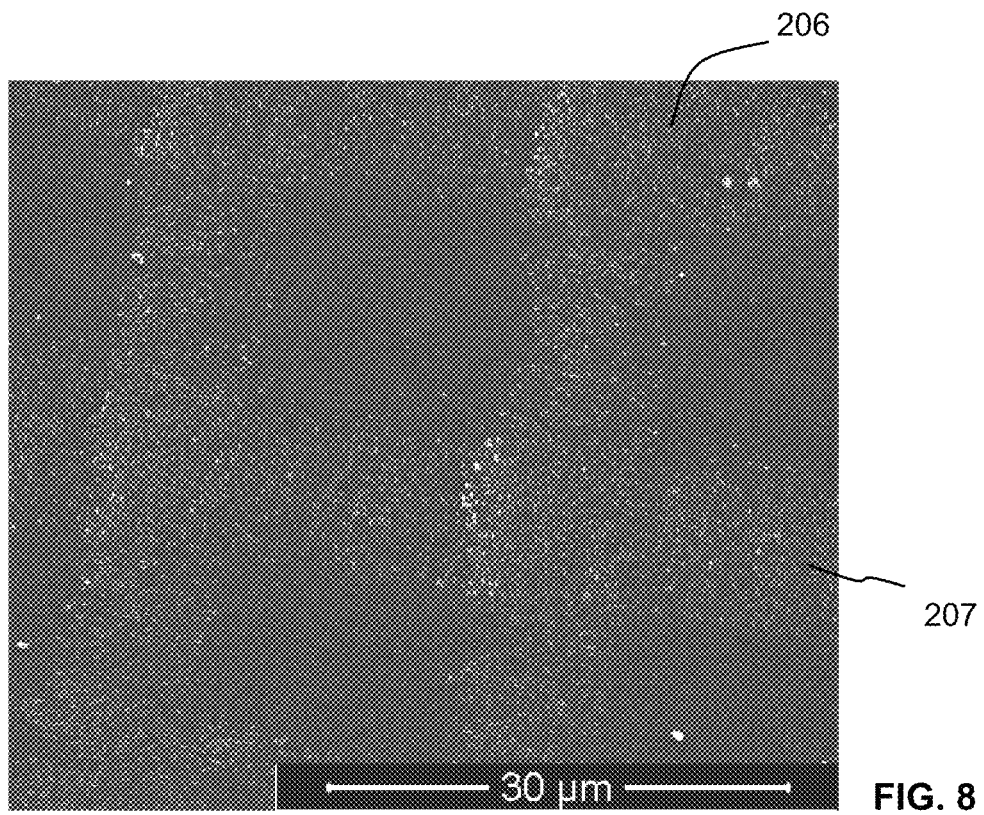
FIG. 8 shows SEM image of silica patterns formed from enrolling a wrinkled PDMS film covered with silica nanoparticles in two orthogonal directions on a receiver substrate.

FIG. 8 shows a SEM image of silica patterns formed on the resulting wrinkled flat PDMS receiver substrate covered with silica nanoparticles in two orthogonal directions, namely a first set of generally parallel rows of silica nanoparticles 206 and a second set of generally parallel rows of silica nanoparticles 207.

From this example it can be concluded 2 dimensional patterns of silica nanoparticles can be formed by the present invention. The donor substrate was flat silicon wafer and the receiver substrate was PDMS.

Example 4

Using the same procedure and materials as in Example 2 the silica nanoparticles were transferred onto a wrinkled PDMS surface immobilized on a roller. Then the roller was rolled onto a wrinkled PDMS receiver substrate in an orthogonal direction to the wrinkles direction of the receiver substrate. The wrinkled PDMS receiver substrate was prepared as described above in step 1B.

Figure 9:
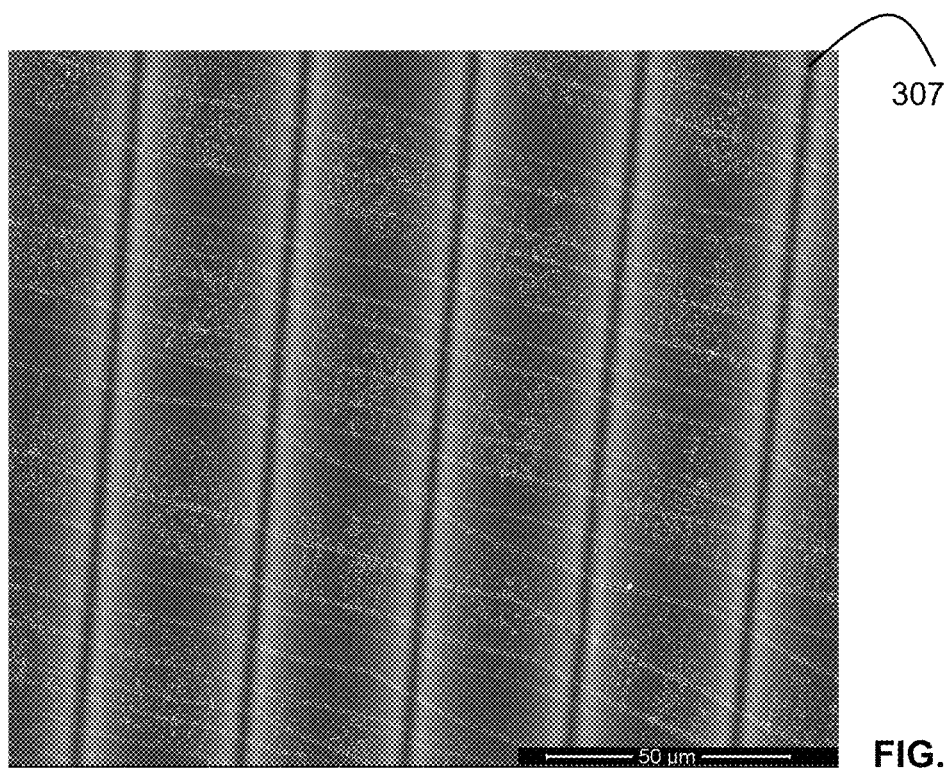
FIG. 9 shows an SEM image of silica patterns formed on a wrinkled receiver substrate after rolling, wherein the wrinkles of the roller were rolled in a direction perpendicular to the direction of the wrinkles of the receiver.

FIG. 9 shows an SEM image of the resulting product having silica patterns formed on the wrinkled receiver substrate after rolling. FIG. 9 shows the receiver substrate wrinkles labeled 307. The lines on FIG. 9 which appear to be scratches are cracks in the substrate.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A method of transferring dry or semi-dry nanoparticles onto a substrate comprising the steps of:
   providing a roller comprising an elastomeric stamp;
   transferring nanoparticles in a dry state or a semi-dry state, and which contact the surface of a donor substrate, from the donor substrate onto the elastomeric stamp; and
   depositing the dry or semi-dry nanoparticles from the elastomeric stamp onto a receiver substrate by rolling the elastomeric stamp onto the receiver substrate.

2. The method of claim 1, wherein the step of transferring nanoparticles from the donor substrate comprises the process of rolling the elastomeric stamp onto the donor substrate, thereby contacting the nanoparticles.

3. The method of claim 1, wherein the nanoparticles are in the dry state.

4. The method of claim 1, wherein the receiver substrate is a non-planar substrate.

5. The method of claim 1, wherein the elastomeric stamp has a relief structure comprising a first pattern, whereby the nanoparticles are deposited onto the surface in the first pattern.

6. The method of claim 1, wherein the method is a photolithography-free microcontact printing method.

7. The method of claim 1, wherein the nanoparticles have a mean particle diameter ("$D_{50}$") of less than about 1000 nm.

8. The method of claim 1, wherein the donor substrate has a relief structure.

9. The method of claim 1, wherein the roller has a relief structure.

10. The method of claim 1, wherein the nanoparticles have a mean particle diameter ("D50") of less than about 100 nm.

11. The method of claim 1, wherein the receiver substrate has a relief structure.

12. The method of claim 1, wherein the nanoparticles have a mean particle diameter ("D50") of less than about 15 nm.

13. The method of claim 1, wherein the nanoparticles are silica nanoparticles.

14. The method of claim 1, wherein the nanoparticles are colloids solutions selected from the group consisting of a noble-metal, metallic, magnetic, mineral, conductive material, a semi-conductive material, a dielectric material and any combination thereof.

15. The method of claim 1, wherein the nanoparticles are selected from the group consisting of a noble-metal, metallic, magnetic, mineral, conductive material, a semi-conductive material, a dielectric material and any combination thereof.

16. The method of claim 1, wherein the nanoparticles are selected from the group consisting of silver, gold, copper, cadmium, palladium, metal complexes, metal alloys, metal oxides, indium-tin oxide, silicon, germanium, gallium arsenide, zinc oxide, zinc selenide and any combination thereof.

17. The method of claim 1, wherein the nanoparticles in dry or semi-dry form are not dispersed in solution.

18. The method of claim 1, wherein the elastomeric stamp is selected from the group consisting of epoxy polymers, polyisoprene polymers, polyurethane polymers, polyimide polymers, polybutadiene polymers, polyvinylchloride, polyethylene, polystyrene polymers, and acrylate polymers, silicone polymers and combinations thereof.

19. The method of claim 1, wherein the elastomeric stamp comprises poly(dimethyl siloxane).

20. The method of claim 1, wherein the method of transferring dry or semi-dry nanoparticles onto the substrate takes less than 10 seconds.

21. The method of claim 1, wherein the method of transferring dry or semi-dry nanoparticles onto the substrate takes less than 1 second.

22. The method of claim 1, for transferring dry or semi-dry nanoparticles onto a receiver substrate the roller elastomeric stamp having a first relief structure;
   transferring the nanoparticles in a dry state or a semi-dry state, which nanoparticles contact the surface of a donor substrate, from the donor substrate onto the elastomeric stamp; and
   depositing the dry or semi-dry nanoparticles from the elastomeric stamp onto the receiver substrate having a second relief structure by rolling the elastomeric stamp onto the receiver substrate in a predetermined direction.

23. The method of claim 22, wherein the first relief structure is capable of forming a first pattern of nanoparticles and wherein the second relief structure is capable of forming a second pattern of nanoparticles, but wherein rolling in the predetermined direction transfers the nanoparticles onto the receiver substrate in a third pattern different from either the first pattern or the second pattern.

24. The method of claim 22, wherein the first pattern and the second pattern are substantially the same.

25. The method of claim 22, wherein the step of transferring nanoparticles from the donor substrate to the elastomeric stamp comprises the process of rolling the elastomeric stamp onto the donor substrate, thereby contacting the nanoparticles.

26. The method of claim 1, for patterning the receiver substrate with at least two species of the nanoparticles, the roller comprising a first elastomeric stamp having a first relief structure, the first relief structure capable of forming a first pattern of nanoparticles;
   transferring a first species of nanoparticles in a dry state or a semi-dry state, which first species of nanoparticles contact the surface of a first donor substrate, from the first donor substrate onto the first elastomeric stamp;
   depositing the first species of nanoparticles from the first elastomeric stamp onto a receiver substrate by rolling the elastomeric stamp onto the receiver substrate in a first predetermined direction;
   providing a roller comprising a second elastomeric stamp having a second relief structure, the second relief structure capable of forming a second pattern of nanoparticles;
   transferring a second species of nanoparticles in a dry state or a semi-dry state, which second species of nanoparticles contact the surface of a second donor substrate, from the second donor substrate onto the second elastomeric stamp; and
   depositing the second species of nanoparticles from the second elastomeric stamp onto the receiver substrate by rolling the second elastomeric stamp onto the receiver substrate in a second predetermined direction.

27. The method of claim 26, wherein the first elastomeric stamp having a first relief structure and the second elastomeric stamp having a second relief structure are capable of forming substantially the same pattern of nanoparticles.

28. The method of claim 26 wherein the first pattern of nanoparticles and the second pattern of nanoparticles are substantially the same.

29. The method of claim 26, wherein the first predetermined direction and the second predetermined direction are substantially the same.

30. A method of patterning a substrate comprising:
   forming a film of nanoparticles on a substrate surface, wherein the nanoparticles are in a dry state or a semi-dry state;
   providing a roller comprising an elastomeric stamp having a relief structure, the relief structure capable of forming a first pattern; and
   removing a portion of the nanoparticles from the substrate surface by rolling the elastomeric stamp onto the substrate surface, whereby remaining nanoparticles on the substrate surface form a negative of the first pattern.

31. The method of claim 30 wherein the step of forming the film of nanoparticles comprises:
   contacting a colloid solution with the substrate surface, the colloid solution comprising at least (i) a liquid component or a solvent component and (ii) at least one species of nanoparticles; and
   allowing the solvent component or the liquid component to evaporate, thereby leaving a film of nanoparticles on the substrate surface.

32. The method of claim 30 wherein the step of contacting the colloid solution with the substrate surface utilizes an application selected from the group consisting of vapor deposition, pouring, casting, jetting, coating, immersion, spraying, spin coating, dip coating and slot coating.

33. A system for transferring dry or semi-dry nanoparticles onto a substrate comprising:
   a roller comprising an elastomeric stamp;
   nanoparticles;
   a donor substrate for transferring the nanoparticles in a dry state or a semi-dry state, and which contact the surface of the donor substrate, from the donor substrate onto the elastomeric stamp; and
   a receiver substrate for receiving the dry or semi-dry nanoparticles from the elastomeric stamp onto the receiver substrate during rolling the elastomeric stamp onto the receiver substrate.

34. The system of claim 33, wherein the donor substrate has a relief structure.

35. The method of claim 33, wherein the roller has a relief structure.

36. The system of claim 33, wherein the receiver substrate has a relief structure.

37. The system of claim 33, wherein the nanoparticles have a mean particle diameter ("D50") at most 100 nm.

* * * * *